Figure 1:
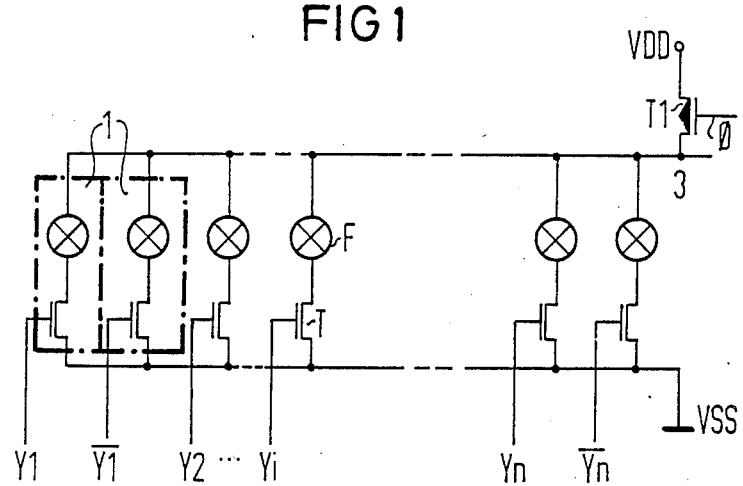

United States Patent [19]

Hoffmann et al.

[11] Patent Number: 4,922,134

[45] Date of Patent: May 1, 1990

[54] TESTABLE REDUNDANCY DECODER OF AN INTEGRATED SEMICONDUCTOR MEMORY

[75] Inventors: Kurt Hoffmann, Taufkirchen; Oskar Kowarik, Grafing; Rainer Kraus; Bernhard Lustig, both of Munich; Hans-Dieter Oberle, Puchheim, all of Fed. Rep. of Germany

[73] Assignee: Siemens Aktiengesellschaft, Munich, Fed. Rep. of Germany

[21] Appl. No.: 309,386

[22] Filed: Feb. 10, 1989

[30] Foreign Application Priority Data

Feb. 10, 1988 [DE] Fed. Rep. of Germany ....... 3804065

[51] Int. Cl.$^5$ .......................................... H03K 19/003
[52] U.S. Cl. ................................. 307/441; 307/202.1; 307/449; 365/200; 365/201
[58] Field of Search ...................... 307/202.1, 441, 449, 307/451, 463, 219, 272.2; 365/200–201, 230.06; 371/10

[56] References Cited

U.S. PATENT DOCUMENTS

| | | | |
|---|---|---|---|
| 3,755,791 | 8/1973 | Arzubi | 365/200 X |
| 4,055,754 | 10/1977 | Chesley | 324/73 R X |
| 4,104,735 | 8/1978 | Hoffmann et al. | 365/230 |
| 4,458,338 | 7/1984 | Giebel et al. | 365/201 |
| 4,538,247 | 8/1985 | Venkateswaran | 365/200 X |
| 4,546,455 | 10/1985 | Iwahashi et al. | 307/449 X |
| 4,588,907 | 5/1986 | Meyer et al. | 307/441 |
| 4,620,116 | 10/1986 | Ozawa | 307/463 X |
| 4,651,030 | 3/1987 | Mimoto | 307/202.1 X |
| 4,672,240 | 6/1987 | Smith et al. | 307/449 |
| 4,689,494 | 8/1987 | Chen et al. | 307/202.1 |
| 4,714,839 | 12/1987 | Chung | 307/441 |
| 4,737,935 | 4/1988 | Wawersig et al. | 365/200 |
| 4,742,490 | 5/1988 | Hoffmann | 365/201 |
| 4,748,597 | 5/1988 | Saito et al. | 307/449 X |
| 4,791,319 | 12/1988 | Tagami et al. | 307/449 X |
| 4,847,810 | 7/1989 | Tagra | 365/200 |
| 4,855,621 | 8/1989 | Hoffmann et al. | 307/441 X |

OTHER PUBLICATIONS

Proceedings of the IEEE, vol. 74, No. 5, May 1986, pp. 684–698, New York, W. R. Moore: "A Review of Fault-Tolerant Techniques for the Enhancement of etc.".
IEEE Journal of Solid-State Circuits, vol. SC-17, No. 5, Oct. 5, 1982, pp. 863–871, IEEE, N.Y.; R. I. Kune et al., "An 8K×8 Dynamic Ram with Self-Refresh".
JEDEC Solid State Products Engineering Council, "Committee Letter Ballot" of Mar. 18, 1987.
Japanese Journal of Applied Physics, Suppl. vol. 22, (1983), Supplement 22-1, Tokyo, Japan, pp. 63–67, "Redundancy Techniques for Dynamic RAMs".

*Primary Examiner*—David Hudspeth
*Attorney, Agent, or Firm*—Herbert L. Lerner; Laurence A. Greenberg

[57] ABSTRACT

A redundancy decoder of an integrated semiconductor memory having a plurality of decoder stages containing a switching transistor and a separable connection having respective conditions in which the separable connection is severed and intact, as well as at least one charging transistor, comprising, in each of the decoder stages, an addressing circuit connected to and between the switching transistor and the separable connection of the respective decoder stages, the addressing circuit being electrically simulatable when the respective separable connection is in the intact condition thereof.

8 Claims, 1 Drawing Sheet

TESTABLE REDUNDANCY DECODER OF AN INTEGRATED SEMICONDUCTOR MEMORY

The invention relates to a redundancy decoder of an integrated semiconductor memory having a pluarlity of decoder stages contaning a switching transistor and separable connection having respective conditions in which the separable connection is severed and intact, as well as at least one charging transistor.

Besides conventional memory cells (normal memory cells) arranged in rows and columns, modern integrated semiconductor memories also contain other so-called redundancy memory cells. These are addressable via other rows and columns, so-called redundancy rows and redundancy columns, by means of redundant decoders (redundancy decoders). They serve as replacements for normal memory cells of peripheral parts of normal memory cells (for example, bit lines, decoders) which are considered to be faulty. With such an arrangement, the yield or usuable amount of integrated semiconductor memories can be increased during manufacture without any significant increase either in the surface area of the chip or manufacturing costs.

Redundancy decoders of this general type have become known heretofore, for example, from European Published Prosecuted Patent Application (EP-A) 0 1790 727. Conventional test runs of semiconductor memories at the wafer level with heretofore known redundancy decoders occur in the following manner: During the first test run, the normal memory cells of the semiconductor memory are tested for function, for example, by means of parallel tests as described in European Published Prosecuted Patent Application (EP-A) 0 186 040. If any faults or defects are found, replacement decoders or so-called redundancy decoders, which have been provided initially deactivated, are irreversibly activated. This results during operation in a likewise irreversible deactivation of the (normal) decoders which select the defective memory regions. Conventionally, the redundancy decoders are activated by severing existing connections. Generally these connections are so-called laser fuses which can be melted and thus severed by means of a laser beam. After this "repair" of the defective memory region, the semiconductor memory is again tested for function at wafer level, during which test the accordingly activated replacement memory region is automatically checked instead of the deactivated defective memory region. Should the replacement memory region also be found to be even partially defective, the considerable time spent on repair and the retesting were unnecessary.

Currently available methods of reducing the time required for testing with parallel tests of several (normal) memory regions, such as are described, for example, in U.S. Pat. No. 4,055,754, can be applied to redundancy memory regions only if these are irreversibly activated i.e. after the effected repairs in the aforementioned second test have taken place.

It is accordingly an object of the invention to provide a redundancy decoder of the foregoing general type which is both irreversibly as well as reversibly activatable, for example, in a test sequence.

With the foregoing and other objects in view, there is provided, in accordance with the invention, a redundancy decoder of an integrated semiconductor memory having a plurality of decoder stages containing a switching transistor and a separable connection having respective conditions in which the separable connection is severed and intact, as well as at least one charging transistor, comprising, in each of the decoder stages, an addressing circuit connected to and between the switching transistor and the separable connection of the respective decoder stages, the severed condition of said separable connection being electrically simulatable by said addressing circuit when the respective separable connection is in the intact condition thereof.

In accordance with another feature of the invention the addressing circuit contains a memory circuit having a memory function introducible by an address signal assigned to the respective decoder stage as well as by control signals, the memory circuit having an output for output signals controlling the simulation of the condition of the severed separable connection.

In accordance with a further feature of the invention the control transistor connected to the memory circuit for feeding the address signal thereto.

In accordance with an added feature of the invention the memory circuit is a bistable flip-flop circuit.

In accordance with an additional feature of the invention the bistable flip-flop circuit is of the RS type.

In accordance with again another feature of the invention the semiconductor memory has a supply potential applied thereto, and the addressing circuit contains a memory circuit having a memory function introducible by the supply potential for controlling the addressing circuit.

In accordance with again a further feature of the invention the semiconductor memory has a reference potential applied thereto, and the addressing circuit contains a memory circuit having a memory function introducible by the reference potential for controlling the addressing circuit.

In accordance with a concomitant feature of the invention the addressing circuit contains a memory circuit, and including a redundancy transistor connecting the memory circuit to the switching transistor and the separable connection.

Other features which are considered as characteristic for the invention are set forth in the appended claims.

Although the invention is illustrated and described herein as embodied in a redundancy decoder of an integrated semi-conductor memory it is nevertheless not intended to be limited to the details shown since various modifications and structural changes may be made therein without departing from the spirit of the invention and within the scope and range of equivalents of the claims.

Figure 2:
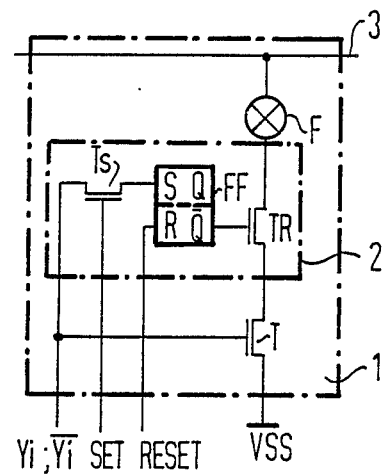

The construction and method of operation of the invention, however, together with additional objects and advantages thereof will be best understood from the following description of specific embodiments when read in connection with the accompanying drawings, in which:

FIG. 1 is a circuit diagram of part of a most recently developed redundancy decoder; and FIG. 2 is a fragmentary view of FIG. 1 incorporating therein a construction in accordance with the invention.

Referring now to the drawing and first, particularly, to FIG. 1 thereof, there is shown therein a conventional redundancy decoder generally constructed as a so-called NOR decoder. Other decoder principles are possible and are applicable as well to the invention of the instant application. Where the semiconductor memory contains $2^n$ selectable rows and columns, respectively, of normal memory cells, a normal redundancy decoder contains $2^2$ parallel switched decoder stages 1. The value of n is determined by the number of external address signals Ai which are to be applied to the semiconductor memory (1<i<n) and which are necessary in order to select one of the rows and columns, respectively, to be used as normal memory cells. During operation, each decoder stage 1 is addressed either by an internal address signal Yi or by an address signal $\overline{Yi}$ which is complementary to the internal address signal $\overline{Yi}$. Generation of the internal address signals Yi and Yi by the external address signal Ai is effected by means of a process previously known, for example, from German Published Prosecuted Patent Application 26 41 524.

Control of the decoder stage 1 is effected via the gate of a switching transistor T having a source which, together with all the sources of the other switching transistors T of the decoder stage 1, is connected, for example, to the reference voltage VSS of the semiconductor memory. The drain of the switching transistor T is connected to one end of a separable connection F. Usually a laser link, also known as a laser fuse, is used as the separable connection F. Examples of other possible configurations can be found in technical publications; in particular, the "Japanese Journal of Applied Physics", supplemental volume 22 (1983), supplemental No. 22-1, Tokyo, Japan, pages 63 to 67, discusses the use of electrically (irreversibly) programmable polysilicon fuses. The other end of the separable connection F is connected to the ends of the separable connections F in the remaining decoder stages 1 of the redundancy decoder to form a common circuit 3. The electrical state of the common circuit 3 determines whether the redundancy decoder is considered as having been selected (for example by a "high" level) or as not having been selected (for example by a corresponding "low" level). In order to realize this, the common circuit 3 is connected to the supply voltage VDD via a charging transistor T1. The charging transistor T1 has a gate which is, for example, also connected to the supply voltage VDD. A decoder control signal 0 can, however, also be applied to the gate, as shown. The timing of the control signal 0 must then be selected so that the charging transistor T1 is charged outside of the decoder phase, whereby the common circuit 3 remains at the potential of the supply voltage VDD and is pre-charged thereto, respectively, and so that the charging transistor T1 is blocked during the decoding phase so that the common circuit 3 is at first floating, that is, remains at the pre-charged or preloaded voltage i.e. remains at the supply voltage VDD.

During the decoding phase, two separate hardware conditions of the redundancy decoder must first be distinguished:

(a) The redundancy decoder is not programmed to act as a replacement for a normal decoder: all separable connections F remain electrically conductive.

(b) The redundancy decoder has been programmed to replace a specific normal decoder, so that when the correct combination of address signals are received, the redundancy memory cells assigned to that particular redundancy decoder are selected.

In case (a), all separable circuits F remain intact i.e. not separated. During the decoding phase, exactly half of the internal address signals Yi, $\overline{Yi}$, . . . Yi, $\overline{Yi}$, . . . applied to the redundancy decoder are active (for example, "high" in the case of n-channel transistors used as switching transistors T), whereby exactly half of the switching transistors are conductive. Because all of the separable connections F are intact, the reference voltage VSS is switched or applied to the common circuit 3, which assumes its nonselected state.

In case (b), the redundancy decoder reacts to a very specific set of address signals Yi;$\overline{Yi}$ namely exactly to that combination for which it was programmed in the event that the separable connections F were to be severed. If this combination is received from address signals Yi;$\overline{Yi}$, specific switching transistors T are switched or connected through from source to drain. These are, however, exactly those switching transistors T whose separable connections F have been severed. The remaining switching transistors T are blocked. Thus, the reference voltage VSS does not reach the common circuit 3, and the supply voltage VDD present thereon remains in a floating state; and the redundancy decoder is selected.

On the other hand, if a different address combination than the one programmed for the severed connections F is received, in the case of at least one of the conducting switching transistors T, the separable connection F connected therewith remains intact. The common circuit 3 is thereby drawn to the reference voltage VSS; and the redundancy decoder is not selected.

The conventional and commonly known redundancy decoder shown in FIG. 1 and described hereinbefore has been improved upon in accordance with the invention, as shown in FIG. 2, so that each decoder stage 1 contains a selection or addressing circuit 2 in addition to the switching transistor T and the separable connection F. This circuit 2 lies between the switching transistor T and the separable connection F. The respective circuit 2, in conjunction with the other addressing switches 2 of the remaining decoder stages 1, serves to prevent a possible current flow from the reference voltage VSS across the switching transistors T and the separable connections F to the common circuit 3 during the decoding phase if the redundancy memory cells which can be reached via the redundancy decoder are to be tested even though the redundancy decoder has not yet been programmed (that is, the separable connections F of the redundancy decoder are all still intact). The common circuit 3 thus remains at the supply potential VDD whereby the aforementioned redundancy memory cells ar selected. The addressing circuit 2 thus simulates the severed condition of the separable connection F even though the separable connecton F is still intact, if the addressing circuit 2 is activated. With a redundancy decoder of such construction, the address of a (temporarily to be replaced) row and column, respectively, of normal memory cells can be programmed via the addressing circuit 2 of the decoder stage 1 of this redundancy decoder. Whereas the addressing of a given address in the semiconductor memory will activate the normal decoder assigned to this given address, the addressing of those addresses at which the redundancy decoder has been temporarily "programmed" will activate this redundancy decoder, and the corresponding normal decoder is deactivated by known control signals (note Published Nonprosecuted European Patent Application 0 170 727). Several redundancy decoders according to the invention, each of which is temporarily programmable for a different address, can be provided for the respective semiconductor memory.

For the purpose of the temporary programming and activation, the addressing circuit 2 of one of the possible embodiments constructed in accordance with the invention contains a memory circuit FF. The memory circuit FF may be a bistable toggle, for example, in the form of a clocked or nonclocked RS flip-flop. The states to be stored ("redundancy decoder for a particular address combination to be temporarily programmed or not?") are fed by decoder stage 1 i.e. also by addressing circuit 2, by means of the internal address signal Yi or $\overline{Yi}$ assigned to that decoder stage 1 in conjunction with the SET and RESET control signals, respectively. By addressing via one address signal Yi;$\overline{Yi}$ per decoder stage 1, each redundancy decoder in the semiconductor memory can be individually programmed for its own address combination. In this way, various redundancy decoders can be randomly addressed via various address combinations.

It is also possible, however, to use the supply voltage VDD or (with inverted logic) the reference voltage VSS of the semiconductor memory in place of the internal address signals Yi or $\overline{Yi}$. In this case, it is not possible, however, to assign to the redundancy decoder a particular address at which it can be (temporarily) activated. Instead, the redundancy decoder is temporarily activatable independently of an address combination fed to it via the switching transistors T. This may be wise if all of the redundancy decoders present as well as the redundancy memory regions assigned thereto are to be tested parallel to one another, or if the semiconductor memory contains only a single redundancy decoder for a redundant row and/or column.

In the embodiment of the invention shown in FIG. 2, the internal address signal Yi or $\overline{Yi}$ is fed to the set input S of the memory circuit FF via a control transistor Ts. At its gate, the control transistor Ts is connected to a set signal SET which acts as a control signal. In order to initiate the function "temporary simulation of an (not actually) occurred separated or severed condition of the separable connection F contained in the respective decoder stages", the set signal SET is activated for all decoder stages 1 of a redundancy decoder during a clock cycle of the semiconductor memory. An address combination made up of address signals Yi;$\overline{Yi}$ and simultaneously addressing the redundancy decoder is stored in the toggle circuit FF of the redundancy decoder. If exactly the same address as was stored in the toggle circuit FF appears during subsequent addressing operations (wherein the set signal SET is no longer activated), the redundancy decoder is activated and at least the normal decoder generally associated with this address is simultaneously deactivated (note Published Nonprosecuted European Patent Application 0 170 727). If different redundancy decoders are to be programmed with a variety of addresses, various signals SET1, SET2, ... should be provided.

For every decoder stage 1, respectively, the negated output Q of the memory circuit FF is connected to the gate of a redundancy transistor TR. This redundancy transistor TR is arranged with its source and drain between the switching transistor T and the separable connection F. In the normal condition wherein the redundancy decoder is not temporarily programmed, the redundancy transistor TR is conductive i.e. it is switched on. Thus, the electronic signal dependent upon the internal addressed Yi;$\overline{Yi}$ and applied to the drain of the switching transistor T is switched through to the separable connection F. In the case, however, wherein the redundancy decoder is to simulate being "programmed", exactly those redundancy transistors TR whose corresponding separable connection F are to simulate being "severed" will block upon the application of the programmed address combination.

By means of a reset signal RESET which acts as another control signal (if necessary or desirable, in all redundancy decoders of a semiconductor memory together) and is fed to the reset input R of every memory circuit FF, the temporarily simulated condition of the redundancy decoders for all addressing circuits 2 of one and all of the redundancy decoders, respectively, which are present, can be simultaneously terminated again.

The control signals SET and RESET can be fed to the redundancy decoders either via external connections to the semiconductor memory, or they can be generated from a simple additional switch connected to already present external connections (such as the address assumption signals $\overline{RAS}$ and $\overline{YiAS}$/, respectively) of the semiconductor memory such as those used by testing units to generate control signals. During this feeding and generating phase, respectively, the external connections assume this special function (respectively introducing and controlling the generation of the control signals); at other times, they revert to their usual functions (for example, address assumption control $\overline{RAS}$, $\overline{CAS}$). The required discrimination of functions of signals applied to the external connections can be effected in various ways. One of the best known methods is, for example, the use of threshold switches (compare German Published Prosecuted Patent Applications DE-A 30 30 852 and DE-A 33 18 564). Another, more elegant method of discriminating between various functions of connections is known from the "COMMITTEE LETTER BALLOT" of Mar. 18, 1987 of the JEDEC, Solid State Products Engineering.

The state of the art testing procedure for a semimconductor memory with redundancy decoders at wafer level or surface can, for example, appear as follows:

(a) Parallel testing of the normal memory, (b) if result is positive: go to step f.

(c) if result is negative: determine the addresses of the respective defective memory cells, word and bit lines, decoders, and the like, (d) (continual) programming of the redundancy decoders with the defective addresses (for example, by severing the laser fuses), (e) retesting the semiconductor memory in order to determine if, on the one hand, the programming was successful and, on the other hand, the activated redundancy memory regions are functioning properly, (f) installing the housings of the intact semiconductor memories.

Parallel testing is not possible in steps (c) and (e).

The following, modified test procedure is possible when using the redundancy decoder according to the invention in the semiconductor memory:

(1) Steps (a) and (b) as above, (2) If the result is negative: Test redundancy memory regions by temporarily electrically simulating the severed condition of the severable connections F.

(3) If this result is also negative: The semiconductor memory has completely failed.

(4) If the result is positive: Steps (c) and (d) as above.

(5) Step (f) as above; implies that possibly some semiconductors in which the permanent programmming failed may be installed.

The advantage derived with regard to the invention of the instant application from the foregoing procedure or sequence of production steps for a semiconductor memory lies in the elimination of step (e). Not only will a potentially lengthy test period be reduced thereby (a large memory capacity is known to require disproportionately lengthy test periods), but also the appertaining retest cycle and the appertaininng preparation time required therefor are eliminated. A disadvantage is that there is no way to test whether the permanent programming (i.e. for example, the melting of the laser fuse per se) was successful before the installation. This type of failure is minimal, however, when compared to the type of failure "defect in the redundancy memory regions" (empirically derived, the ratio is approximately 1:10), so that the aforedescribed attainable advantage is much greater than the minor disadvantage which must be taken into consideration.

The foregoing is a description corresponding in substance to German Application P 38 04 065.4, dated Feb. 10, 1988, the International priority of which is being claimed for the instant application, and which is hereby made part of this application. Any material discrepancies between the foregoing specification and the aforementioned corresponding German application are to be resolved in favor of the later.

We claim:

1. A redundancy decoder of an integrated semiconductor memory having a plurality of decoder stages containing a switching transistor and a separable connection having respective conditionns inn which the separable connection is severed and intact, as well as at least one charging transistor, comprising, in each of the decoder stages, an addressing circuit connected to and between the switching transistor and the separable connection of the respective decoder stages, said severed condition of said separable connection being electrically simulatable by said addressing circuit when the respective separable connection is in the intact condition thereof.

2. A redundancy decoder according to claim 1, wherein said addressing circuit contains a memory circuit having a memory function introducible by an address signal assigned to the respective decoder stage as well as by control signals, said memory circuit having an output for output signals controlling the simulation of the condition of the severed separable connection.

3. A redundancy decoder according to claim 2, including a control transistor connected to said memory circuit for providing said address signal thereto.

4. A redundancy decoder according to claim 2, wherein said memory circuit is a bistable flip-flop circuit.

5. A redundancy decoder according to 4, wherein said bistable flip-flop circuit is of the RS type.

6. A redundancy decoder according to claim 1, wherein the semiconductor memory has a supply potential applied thereto, and said addressing circuit contains a memory circuit having a memory function introducible by said supply potential for controlling said addressing circuit.

7. A redundancy decoder according to claim 1 wherein the semiconductor memory has a reference potential applied thereto, and said addressing circuit contains a memory circuit having a memory function introducible by said reference potential for controlling said addressing circuit.

8. A redundancy decoder according to claim 1, wherein said addressing circuit contains a memory circuit, and including a redundancy transistor connecting said memory circuit to said switching transistor and said separable connection.

* * * * *